United States Patent [19]
Fujii et al.

[11] Patent Number: 5,712,001
[45] Date of Patent: Jan. 27, 1998

[54] CHEMICAL VAPOR DEPOSITION PROCESS FOR PRODUCING OXIDE THIN FILMS

[75] Inventors: Eiji Fujii; Atsushi Tomozawa; Hideo Torii; Ryoichi Takayama, all of Osaka, Japan

[73] Assignee: Matsushita Electric Industrial Co., Ltd., Osaka, Japan

[21] Appl. No.: 619,076

[22] Filed: Mar. 20, 1996

[30] Foreign Application Priority Data

Mar. 20, 1995 [JP] Japan ............................ 7-060331

[51] Int. Cl.$^6$ ............................................. B05D 3/06
[52] U.S. Cl. ............... 427/576; 427/573; 427/255.3; 427/255.5
[58] Field of Search ................ 427/576, 573, 427/255.3, 255.5

[56] References Cited

U.S. PATENT DOCUMENTS

| | | | |
|---|---|---|---|
| 4,975,324 | 12/1990 | Torii et al. | 427/576 |
| 4,976,996 | 12/1990 | Monkowski et al. | 427/255 |
| 5,017,404 | 5/1991 | Paquet et al. | 427/45.1 |
| 5,234,502 | 8/1993 | Mochizuki et al. | 118/723 |

FOREIGN PATENT DOCUMENTS

| | | |
|---|---|---|
| 0 265 246 | 4/1988 | European Pat. Off. . |
| 0 479 547 | 4/1992 | European Pat. Off. . |
| 2 411 897 | 7/1979 | France . |
| 58-209118 | 12/1983 | Japan . |
| 58-213413 | 12/1983 | Japan . |
| 3-191069 | 8/1991 | Japan . |
| 3-287770 | 12/1991 | Japan . |
| 4-157163 | 5/1992 | Japan . |
| 6-097080 | 4/1994 | Japan . |

OTHER PUBLICATIONS

"Thin Films of Magnesium Oxide Prepared by Plasma-Enhanced Chemical Vapour Deposition", by Yu-Wen Zhao et al., *Applied Physics A*, 54, pp. 451-454, 1992.

*Primary Examiner*—Roy V. King
*Attorney, Agent, or Firm*—Merchant, Gould, Smith, Edell, Welter & Schmidt, P.A.

[57] ABSTRACT

The present invention relates to a process for producing crystallographic oriented oxide thin films having an NaCl-type structure, a spinel structure or a Wurtzite structure used as a buffer layer to obtain a functional oxide thin film such as a superconductive oxide thin film and a ferroelectric thin film, and a chemical vapor deposition apparatus used therefor. A rotatable substrate holder is provided in a reaction chamber. The substrate holder, which holds substrates thereunder, includes a substrate heater. The substrate holder is grounded to provide an electrode. Another electrode, which is connected to a high frequency power source, is located opposing the substrate holder in the reaction chamber. At a side wall of the reaction chamber, an exhaust is arranged. In a plasma electric discharge area formed between the substrate holder and the electrode, a material gas supplier is located, having a predetermined tilt angle θ with respect to the substrate holder.

7 Claims, 4 Drawing Sheets

CHEMICAL VAPOR DEPOSITION PROCESS FOR PRODUCING OXIDE THIN FILMS

BACKGROUND OF THE INVENTION

1. Field of the Invention

The present invention relates to a process for producing crystallographic oriented oxide thin films having an NaCl-type structure, a spinel structure or a Wurtzite structure used as a buffer layer to obtain a functional oxide thin film such as a superconductive oxide thin film or a ferroelectric thin film, and a chemical vapor deposition apparatus used therefor.

2. Description of the Prior Art

Studies are actively conducted to produce crystallographic oriented oxide thin films of an NaCl-type structure, a spinel structure or a Wurtzite structure on a low-cost substrate such as a glass substrate to be used as a buffer layer to obtain a functional oxide thin film such as a superconductive oxide thin film or a ferroelectric thin film. In particular, a plasma-enhanced chemical vapor deposition method using a metal complex as a starting material can provide crystallographic oriented oxide thin films of an NaCl-type structure, a spinel structure or a Wurtzite structure regardless of the kind of the substrate. This method is to generate a high frequency plasma between parallel plate electrodes so as to provide a mixed gas including material gas (gas of a β-diketone metal complex) and oxide gas to a substrate located on the surface of one of the electrodes like shower (Yu-Nen Zhao and H. Suhr: Appl. Phys. A 54 (1992) 451–454).

However, by the above mentioned conventional method, due to the difficulty in providing a great amount of the material gas uniformly onto a large area of the substrate due to low vapor pressure of β-diketone metal complex used as the starting material, and difficulty in having a laminar flow of the gas on the surface of the substrate, it has been difficult to produce a high-quality crystallographic oriented oxide thin film uniformly in a large area at a high speed.

In order to solve the above mentioned problems of conventional arts, an object of the present invention is to provide a process for producing produce crystallographic oriented oxide thin films of an NaCl-type structure, a spinel structure or a Wurtzite structure used as a buffer layer to obtain a functional oxide thin film such as a superconductive oxide thin film and a ferroelectric thin film uniformly in a large area at a high speed, and a chemical vapor deposition apparatus used therefor.

SUMMARY OF THE INVENTION

In order to achieve the above mentioned object, an aspect of a production process for oxide thin films of the present invention comprises the steps of introducing a material gas into a reaction chamber having an exhaust means, supplying electric power between a substrate holder (which acts as an electrode) and an electrode located in the reaction chamber to produce plasma from the material gas to be introduced onto a substrate having a predetermined temperature held on the substrate holder. The material gas includes a metal complex gas, oxygen gas and a carrier gas and is introduced to the substrate with the substrate holder rotating by means of a material gas supplier located between the substrate holder and the electrode with a predetermined tilt angle with respect to the substrate holder.

In the above mentioned aspect of the production process of the present invention, it is preferable that the metal complex is a β-diketone complex of a metal selected from the group consisting of magnesium, nickel and cobalt.

In the above mentioned aspect of the production process of the present invention, it is preferable that the metal complex is a β-diketone complex of a metal selected from the group consisting of iron and cobalt.

In the above mentioned aspect of the production process of the present invention, it is preferable that the metal complex is a β-diketone complex of zinc.

In the above mentioned aspect of the production process of the present invention, it is preferable that the substrate temperature at the time of forming an oxide thin film is from 150° C. to 650° C.

In the above mentioned aspect of the production process of the present invention, it is preferable that the pressure in the reaction chamber at the time of forming an oxide thin film is from $5 \times 10^{-3}$ to 5 Torr.

In the above mentioned aspect of the production process of the present invention, it is preferable that the tilt angle of the material gas supply means with respect to the substrate holder is from 5° to 45°.

An aspect of a chemical vapor deposition apparatus of the present invention comprises at least a reaction chamber having an exhaust, a rotatable substrate holder (which acts as an electrode) including a substrate heater located in the reaction chamber to accomodate a substrate, an electrode located in the reaction chamber opposing the substrate holder and connected to a high frequency power source, and a material gas supply means located between the substrate holder and the electrode with a predetermined tilt angle with respect to the substrate holder.

In the above mentioned aspect of the chemical vapor deposition apparatus of the present invention, it is preferable that the tilt angle of the material gas supplier with respect to the substrate holder is from 5° to 45°.

According to the above mentioned aspect of the present invention, since the process for producing oxide thin films of the present invention comprises the steps of introducing a material gas into a reaction chamber having an exhaust means, supplying electric power between a substrate holder (which acts as an electrode) and an electrode located in the reaction chamber to produce plasma from the material gas to be provided onto a substrate having a predetermined temperature held on the substrate holder, wherein the material gas includes a metal complex gas, oxygen gas and a carrier gas and is introduced to the substrate with the substrate holder rotating by means of a material gas supplier located between the substrate holder and the electrode with a predetermined tilt angle with respect to the substrate holder, a material gas can easily form a laminar flow on the substrate. Further, an oxide thin film can be formed intermittently by repeating processes of forming a film on an area of the substrate in contact with the material gas and annealing the film in an area of the substrate not in contact with the material gas. As a result, a parallelly crystallographic oriented oxide thin film can be obtained on the substrate. In particular, since a material gas supply means located between a substrate holder and an electrode in the plasma electric discharge area is used with the substrate holder rotating, an oxide thin film can be formed uniformly in a large area.

According to a preferable embodiment of the aspect of the production process of the present invention in which the metal complex is a β-diketone complex of a metal selected from the group consisting of magnesium, nickel and cobalt, a thin film of magnesium oxide, nickel oxide or cobalt oxide, crystallographically oriented with respect to the (100) face, the (111) face or the (110) face and having an NaCl-type structure, can be obtained.

According to a preferable embodiment in the aspect of the production process of the present invention in which the metal complex is a β-diketone complex of a metal selected from the group consisting of iron and cobalt, a thin film of iron oxide or cobalt oxide, crystallographically oriented with respect to the (100) face or the (111) face and having a spinel structure, can be obtained.

According to a preferable embodiment of the aspect of the production process of the present invention in which the metal complex is a β-diketone complex of zinc, a thin film of zinc oxide, crystallographically oriented with respect to the (001) face and having a Wurtzite structure, can be obtained.

According to a preferable embodiment of the aspect of the production process of the present invention in which the substrate temperature at the time of forming an oxide thin film is from 150° to 650° C., a high quality crystallographic oriented oxide thin film can be obtained efficiently.

According to a preferable embodiment of the aspect of the production process of the present invention in which the pressure in the reaction chamber at the time of forming an oxide thin film is from $5 \times 10^{-3}$ to 5 Torr, a high quality crystallographic oriented oxide thin film can be obtained efficiently.

According to a preferable embodiment of the aspect of the production process of the present invention in which the tilt angle of the material gas supplier with respect to the substrate holder is from 5° to 45°, a high quality crystallographic oriented oxide thin film can be obtained efficiently at a high deposition rate.

According to the above mentioned aspect of the apparatus of the present invention, since at least a reaction chamber having an exhaust means, a rotatable substrate holder (which acts as an electrode), including a substrate heater located in the reaction chamber to accomodate a substrate, an electrode located in the reaction chamber opposing the substrate holder and connected to a high frequency power source, and a material gas supplier located between the substrate holder and the electrode with a predetermined tilt angle with respect to the substrate holder are included for carrying out the above mentioned production process, a chemical vapor deposition apparatus capable of producing high quality crystallographic oriented oxide thin films uniformly in a large area at high speed can be provided.

DETAILED DESCRIPTION OF THE INVENTION

Hereinafter the present invention will be further explained with reference to the Examples.

<Example 1>

Figure 1:
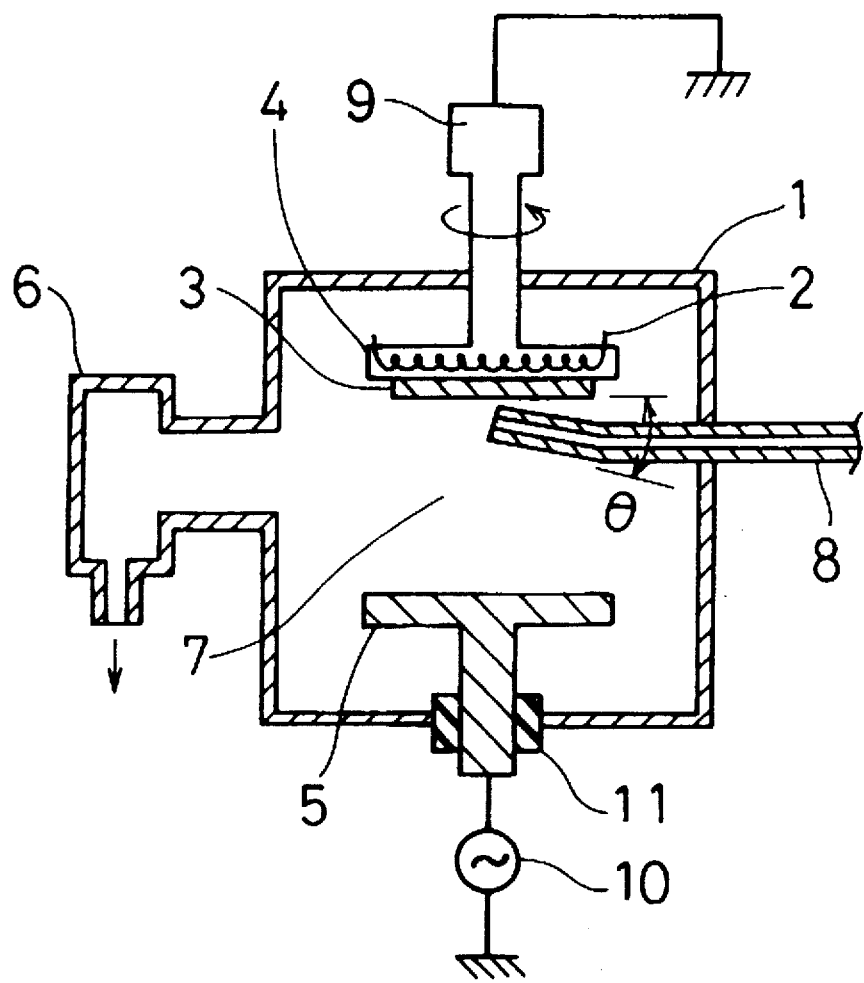
FIG. 1 is a sectional view of a chemical vapor deposition apparatus of Example 1 of the present invention.

FIG. 1 is a sectional view of a chemical vapor deposition apparatus of Example 1 of the present invention.

As illustrated in FIG. 1, a rotatable substrate holder 4 is provided in a reaction chamber 1. The substrate holder 4, which holds substrates 3 thereunder, includes a substrate heater 2. The substrate holder 4 is grounded so that it can act as an electrode. Another electrode 5 is located opposing the substrate holder 4 in the reaction chamber 1. At a side wall of the reaction chamber 1, an exhaust 6 for keeping the inside of the reaction chamber 1 in a low pressure state is provided. In a plasma electric discharge area 7 formed between the substrate holder 4 and the electrode 5, a material gas supplier 8 is disposed at a predetermined tilt angle θ with respect to the substrate holder 4. In FIG. 1, numeral 9 denotes a rotating device to rotate the substrate holder 4, 10 a high frequency power source (13.56 MHz) to supply electric power to the electrode 5, and 11 an insulator to insulate the electrode 5 from the reaction chamber 1, for example made of Teflon (trade name for polytetrafluoroethylene produced by Dupont).

A process for forming an oxide thin film using a chemical vapor deposition apparatus with the above mentioned constitution will be explained. The inside of the reaction chamber 1 is exhausted by the exhaust 6 to be kept in a low pressure state. The substrate 3 is heated by the substrate heater 2. With the substrate holder 4 rotating, a material gas for forming an oxide thin film is supplied to the reaction chamber 1 by the material gas supplier 8. By supplying electric power between the substrate holder 4 and the electrode 5 in the above mentioned state, plasma electric discharge occurs. By this operation, an oxide thin film can be formed on the substrate 3.

As mentioned above, since the material gas supplier 8 is disposed at a predetermined tilt angle θ with respect to the substrate holder 4, a material gas can easily form a laminar flow on the substrate 3. That is, a material gas can flow parallel to the surface of the substrate 3. Further, a film is formed on an area of the substrate 3 in contact with the material gas and the film is annealed in an area of the substrate 3 not in contact with the material gas. By repeating these processes, an oxide thin film can be produced intermittently. Consequently, an oxide thin film having a parallel crystallographic orientation can be formed on the substrate 3. In particular, since the material gas supplier 8 is arranged between the substrate holder 4 and the electrode 5 (in the plasma electric discharge area 7) and the substrate holder 4 is rotatable, an oxide thin film can be formed uniformly in a large area. By locating the material gas supplier 8 in the plasma electric discharge area 7, namely, in the vicinity of the substrate 3, even when a material gas having a low vapor pressure such as a material gas including a metal complex is used, a great amount of the material gas can reach the substrate 3.

<Example 2>

Figure 2:
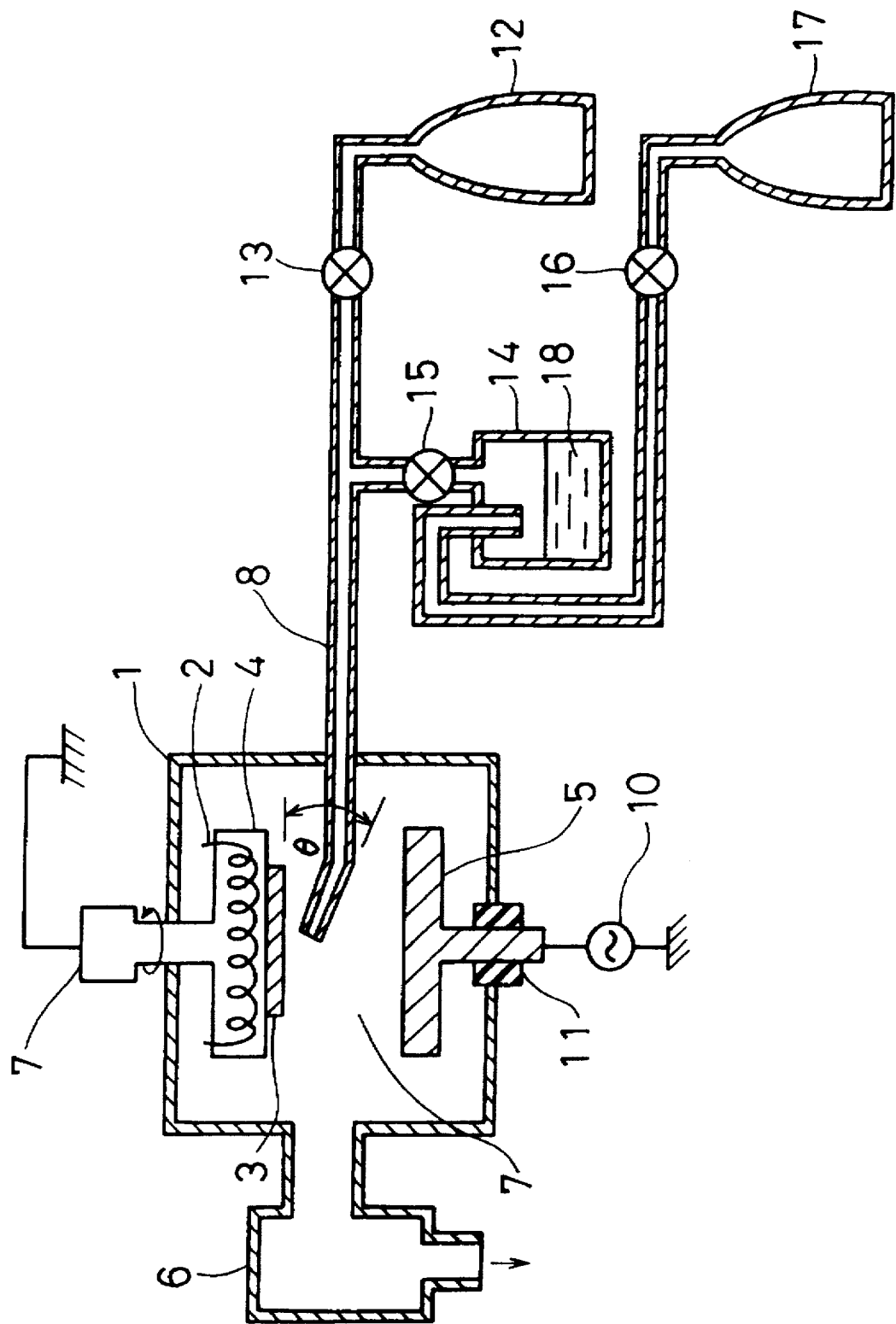
FIG. 2 is a sectional view of a chemical vapor deposition apparatus of Example 2 of the present invention.

FIG. 2. is a sectional view of a chemical vapor deposition apparatus of Example 2 of the present invention.

FIG. 2 illustrates a chemical vapor deposition apparatus further comprising a gaseous oxygen bomb 12, communicating via a valve 13, and a vaporizer 14 communicating via a valve 15 through the material gas supplier 8 illustrated in FIG. 1. The vaporizer 14 is further connected to a gaseous nitrogen bomb 17 via a valve 16. A solid metal complex 18 is placed in the vaporizer 14. Since other elements are the same as Example 1, detailed explanation is not provided here. The diameter of the substrate holder 4 and the electrode 5 is 400 mm. The substrate holder 4 holds four square substrates 3 of 100 mm×100 mm×1.1 mm size therebelow.

The principle of the film formation will be explained hereinafter.

Figure 3:
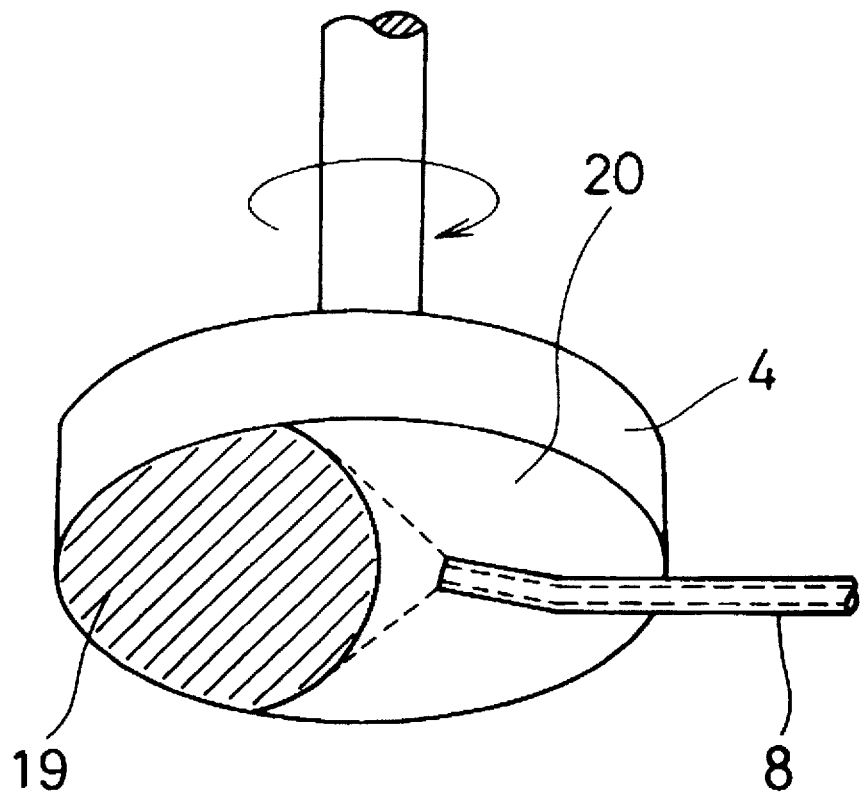
FIG. 3 is a perspective view of a substrate holder of a chemical vapor deposition apparatus of Example 2 of the present invention (a substrate is not illustrated).
Figure 4:
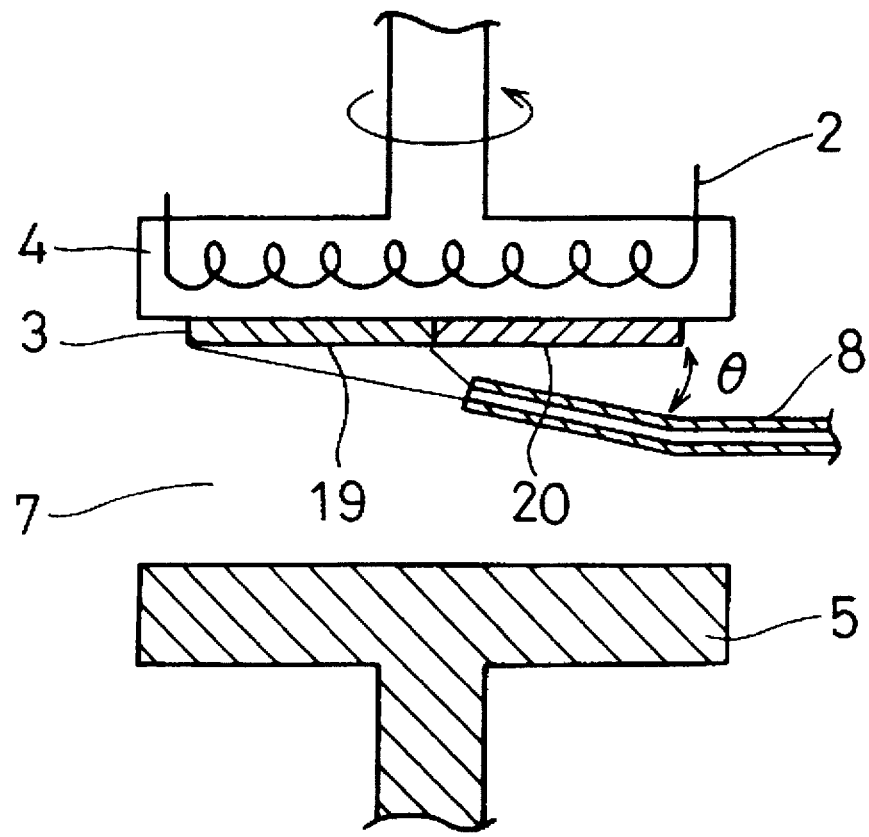
FIG. 4 is a sectional view of a plasma electric discharge area of a chemical vapor deposition apparatus of Example 2 of the present invention.

FIG. 3 is a perspective view of a substrate holder 4 (not showing substrates 3), and FIG. 4 is a sectional view of the plasma electric discharge area 7. As illustrated in FIGS. 3 and 4, when a material gas is supplied from the material gas supplier 8, which is positioned with a predetermined tilt angle θ with respect to the substrate holder 4, a film is formed on the substrates 3 in an area in contact with the material gas 19, and the film is annealed in an area not in contact with the material gas 20. By repeating the processes, a good crystallographically oriented thin film can be obtained.

Concrete examples of methods of producing various crystallographically oriented thin films with chemical vapor deposition apparatus of the above mentioned constitution will be explained.

(Concrete Example 1)

Magnesium acetylacetonate (Mg $(C_5H_7O_2)_2$), which is a kind of a β-diketone metal complex, was placed in the vaporizer 14 of FIG. 2 as the metal complex 18 starting material, and then heated and maintained at 235° C. The tilt angle of the material gas supplier 8 with respect to the substrate holder 4 (substrate-nozzle angle) was set to be 20°. The pressure of the inside of the reaction chamber 1 was reduced to 0.1 Torr by the exhaust 6. Soda-lime glass substrates, which were used as the substrates 3, were heated to 350° C. by the substrate heater 2. First, the valve 16 was opened to supply nitrogen gas at a 100 sccm flow rate from the nitrogen gaseous bomb 17 as the carrier gas to the vaporizer 14 containing magnesium acetylacetonate. Then the valves 13 and 15 were opened to supply oxygen gas at a 200 sccm flow rate from the oxygen gaseous bomb 12 as the reactive gas together with the vapor of $Mg(C_5H_7O_2)_2$ and the nitrogen gas. By this procedure, a material gas comprising the vapor of $Mg(C_5H_7O_2)_2$, the nitrogen gas and the oxygen gas were introduced into the reaction chamber 1 to generate plasma with an rf power of 1.4 W/cm². As a result of the reaction for 20 minutes, a magnesium oxide (MgO) film was formed on the substrates 3. The revolution rate of the substrates 3 was 60 rpm. After the formation of the MgO film, the substrates 3 were cooled to around the room temperature. Then the four substrates 3 were taken out from the reaction chamber 1 to be analyzed with X-ray diffraction, refraction high-energy electron diffraction and scanning electron microscope. In the process, the outside perimeter of the substrate, where the film formation was insufficient, was cut off by 5 mm. Then the substrates, which were 90 mm square in shape, were cut into 10 mm square pieces, and all the specimen pieces were analyzed. The result showed that the formed MgO film of all the specimen pieces had an NaCl-type crystalline structure with a good crystallization and a high crystallographic orientation with respect to the (100) face. The result of the scanning electron microscope analysis showed that the formed MgO film had a closely packed polycrystalline film with a grain size of approximately 0.1 μm. The film had a smooth surface, a thickness of 1.2 μm and a deposition rate of 60 nm/min. Variance of the film thicknesses among the specimen pieces was within 3%. The second line of the below mentioned Table 1 shows the production conditions and analysis results of Concrete Example 1.

(Concrete Example 2)

An oxide thin film was formed on the substrates 3 with some production conditions altered from Concrete Example 1. That is, with vaporization temperature of 240° C., flow rate of the carrier gas (nitrogen gas) of 90 sccm, flow rate of the oxygen gas ($O_2$) of 40 sccm, rf power of 1.0 W/cm², pressure of 0.4 Torr, substrate 3 temperature of 200° C., and the revolution rate of the substrates 3 of 100 rpm, an oxide thin film was formed on the substrates 3. Consequently, an MgO film having an NaCl-type crystalline structure oriented with respect to the (110) face was obtained as shown in the third line of the below mentioned Table 1. The deposition rate was 70 nm/min.

(Concrete Example 3)

An oxide thin film was formed on the substrates 3 with the starting material, substrates 3 and some production conditions altered from Concrete Example 1. That is, with the starting material of $Mg(C_{11}H_{19}O_2)_2$, vaporization temperature of 100° C., rf power of 1.0 W/cm², pressure of 1 Torr, substrates 3 of silicon single crystal (111), substrate 3 temperature of 500° C., and the revolution rate of the substrates 3 of 1 rpm, an oxide thin film was formed on the substrates 3. Consequently, an MgO film having an NaCl-type crystalline structure oriented with respect to the (100) face was obtained as shown in the fourth line of the below mentioned Table 1. The deposition rate was 83 nm/min.

(Concrete Example 4)

An oxide thin film was formed on the substrates 3 with the starting material, substrates 3 and some production conditions altered from Concrete Example 1. That is, with the starting material of nickel metal complex $(Ni(C_5H_7O_2)_2 \cdot 2H_2O)$, vaporization temperature of 170° C., flow rate of the carrier gas (nitrogen gas) of 50 sccm, flow rate of the oxygen gas($O_2$) of 100 sccm, rf power of 1.5 W/cm², pressure of 0.2 Torr, substrate-nozzle angle of 5°, substrates 3 of stainless steel, substrate 3 temperature of 300° C., and the revolution rate of the substrates 3 of ⅙ rpm, an oxide thin film was formed on the substrates 3. Consequently, an NiO film having an NaCl-type crystalline structure oriented with respect to the (100) face was obtained as shown in the fifth line of the below mentioned Table 1. The deposition rate was 104 nm/min.

(Concrete Example 5)

An oxide thin film was formed on the substrates 3 with the starting material, substrates 3 and some production conditions altered from Concrete Example 1. That is, with the starting material of nickel metal complex $(Ni(C_5H_7O_2)_2 \cdot 2H_2O)$, vaporization temperature of 170° C., flow rate of the oxygen gas ($O_2$) of 40 sccm, rf power of 1.0 W/cm², pressure of 0.01 Torr, substrate-nozzle angle of 30°, substrates 3 of aluminum, substrate 3 temperature of 150° C., and the revolution rate of the substrates 3 of 120 rpm, an oxide thin film was formed on the substrates 3. Consequently, an NiO film having an NaCl-type crystalline structure oriented with respect to the (100) face similar to the result of Concrete Example 4 was obtained as shown in the sixth line of the below mentioned Table 1. The deposition rate was 110 nm/min.

(Concrete Example 6)

An oxide thin film was formed on the substrates 3 with the starting material and some production conditions altered from Concrete Example 1. That is, with the starting material of nickel metal complex $(Ni(C_{11}H_{19}O_2)_2)$, vaporization temperature of 140° C., flow rate of the oxygen gas ($O_2$) of 20 sccm, rf power of 1.0 W/cm², pressure of 0.005 Torr, substrate-nozzle angle of 45°, substrate 3 temperature of 400° C., and the revolution rate of the substrates 3 of 50 rpm, an oxide thin film was formed on the substrates 3. Consequently, an NiO film having an NaCl-type crystalline structure oriented with respect to the (111) face was obtained as shown in the seventh line of the below mentioned Table 1. The deposition rate was 90 nm/min.

(Concrete Example 7)

An oxide thin film was formed on the substrates 3 with starting material, substrates 3 and some production conditions altered from Concrete Example 1. That is, with the starting material of cobalt metal complex ($Co(C_5H_7O_2)_3$), vaporization temperature of 145° C., flow rate of the carrier gas (nitrogen gas) of 40 sccm, flow rate of the oxygen gas ($O_2$) of 15 sccm, rf power of 0.8 W/cm$^2$, pressure of 0.01 Torr, substrate-nozzle angle of 10°, substrates 3 of silicon single crystal (100), substrate 3 temperature of 650° C., and the revolution rate of the substrates 3 of 100 rpm, an oxide thin film was formed on the substrates 3. Consequently, a cobalt oxide (CoO) film having an NaCl-type crystalline structure oriented with respect to the (100) face was obtained as shown in the eighth line of the below mentioned Table 1. The deposition rate was 45 nm/min.

(Concrete Example 8)

An oxide thin film was formed on the substrates 3 with the starting material, substrates 3 and some production conditions altered from Concrete Example 1. That is, with the starting material of cobalt metal complex ($Co(C_5H_7O_2)_3$), vaporization temperature of 145° C., flow rate of the oxygen gas ($O_2$) of 30 sccm, rf power of 1.2 W/cm$^2$, substrate-nozzle angle of 10°, substrates 3 of sapphire (012), substrate 3 temperature of 250° C., and the revolution rate of the substrates 3 of 40 rpm, an oxide thin film was formed on the substrates 3. Consequently, a CoO film having an NaCl-type crystalline structure oriented with respect to the (100) face similar to the result of Concrete Example 7 was obtained as shown in the ninth line of the below mentioned Table 1. The deposition rate was 60 nm/min.

(Concrete Example 9)

An oxide thin film was formed on the substrates 3 with the starting material and some production conditions altered from Concrete Example 1. That is, with the starting material of cobalt metal complex ($Co(_5H_7O_2)_2.2H_2O$), vaporization temperature of 125° C., flow rate of the oxygen gas ($O_2$) of 20 sccm, rf power of 1.0 W/cm$^2$, substrate-nozzle angle of 10°, substrate 3 temperature of 300° C., and the revolution rate of the substrates 3 of 1/3 rpm, an oxide thin film was formed on the substrates 3. Consequently, a CoO film having an NaCl-type crystalline structure oriented with respect to the (100) face similar to the result of Concrete Example 7 was obtained as shown in the tenth line of the below mentioned Table 1. The deposition rate was 95 nm/min.

(Concrete Example 10)

An oxide thin film was formed on the substrates 3 with the starting material, substrates 3 and some production conditions altered from Concrete Example 1. That is, with the starting material of cobalt metal complex ($Co(C_5H_7O_2)_2.2H_2O$), vaporization temperature of 125° C., flow rate of the carrier gas (nitrogen gas) of 150 sccm, flow rate of the oxygen gas ($O_2$) of 60 sccm, rf power of 1.0 W/cm$^2$, pressure of 5 Torr, substrates 3 of silicon single crystal (111), substrate 3 temperature of 450° C., and the revolution rate of the substrates 3 of 10 rpm, an oxide thin film was formed on the substrates 3. Consequently, a CoO film having an NaCl-type crystalline structure oriented with respect to the (100) face similar to the result of Concrete Example 7 was obtained as shown in the eleventh line of the below mentioned Table 1. The deposition rate was 108 nm/min.

(Concrete Example 11)

An oxide thin film was formed on the substrates 3 with some production conditions altered from Concrete Example 9. That is, with the flow rate of the oxygen gas ($O_2$) of 150 sccm, pressure of 0.2 Torr, substrate-nozzle angle of 20°, substrate 3 temperature of 450° C., and the revolution rate of the substrates 3 of 50 rpm, an oxide thin film was formed on the substrates 3. Consequently, a cobalt oxide ($Co_3O_4$) film having a spinel crystalline structure oriented with respect to the (100) face was obtained as shown in the second line of the below mentioned Table 2. The result of the scanning electron microscope analysis showed that the formed $Co_3O_4$ film had a closely packed polycrystalline film with a grain size of approximately 0.07 μm. The film had a smooth surface, a thickness of 1.6 μm and a deposition rate of 80 nm/min. Variance of the film thickness among the specimen pieces was within 3%.

(Concrete Example 12)

An oxide thin film was formed on the substrates 3 with some production conditions altered from Concrete Example 9. That is, with the flow rate of the oxygen gas ($O_2$) of 150 sccm, pressure of 5 Torr, substrate-nozzle angle of 5°, substrate 3 temperature of 150° C., and the revolution rate of the substrates 3 of 50 rpm, an oxide thin film was formed on the substrates 3. Consequently, a $Co_3O_4$ film having a spinel crystalline structure oriented with respect to the (111) face was obtained as shown in the third line of the below mentioned Table 2. The deposition rate was 78 nm/min.

(Concrete Example 13)

An oxide thin film was formed on the substrates 3 with some production conditions altered from Concrete Example 7. That is, with the vaporization temperature of 140° C. flow rate of the carrier gas (nitrogen gas) of 100 sccm, flow rate of the oxygen gas ($O_2$) of 70 sccm, pressure of 0.05 Torr, substrate-nozzle angle of 20°, and substrate 3 temperature of 200° C., an oxide thin film was formed on the substrates 3. Consequently, a $Co_3O_4$ film having a spinel crystalline structure oriented with respect to the (111) face similar to the result of Concrete Example 12 was obtained as shown in the fourth line of the below mentioned Table 2. The deposition rate was 72 nm/min.

(Concrete Example 14)

An oxide thin film was formed on the substrates 3 with starting material, substrates 3 and some production conditions altered from Concrete Example 1. That is, with the starting material of iron metal complex ($Fe(C_5H_7O_2)_3$), vaporization temperature of 130° C., flow rate of the carrier gas (nitrogen gas) of 150 sccm, flow rate of the oxygen gas ($O_2$) of 100 sccm, rf power of 1.0 W/cm$^2$, pressure of 0.4 Torr, substrate 3 of stainless steel, substrate 3 temperature of 400° C. and the revolution rate of the substrates 3 of 10 rpm, an oxide thin film was formed on the substrates 3. Consequently, an iron oxide ($Fe_3O_4$) film having a spinel crystalline structure oriented with respect to the (100) face was obtained as shown in the fifth line of the below mentioned Table 2. The deposition rate was 92 nm/min.

(Concrete Example 15)

An oxide thin film was formed on the substrates 3 with the starting material and some production conditions altered from Concrete Example 1. That is, with the starting material of iron metal complex ($Fe(C_{11}H_{19}O_2)_3$), vaporization temperature of 120° C., flow rate of the carrier gas (nitrogen gas) of 70 sccm, flow rate of the oxygen gas ($O_2$) of 60 sccm, rf power of 0.7 W/cm$^2$, pressure of 0.005 Torr, substrate-nozzle angle of 45° and the revolution rate of the substrates 3 of 150 rpm, an oxide thin film was formed on the substrates 3. Consequently, an $Fe_3O_4$ film having a spinel crystalline structure oriented with respect to the (100) face similar to the result of Concrete Example 14 was obtained as shown in the sixth line of the below mentioned Table 2. The deposition rate was 106 nm/min.

(Concrete Example 16)

An oxide thin film was formed on the substrates 3 with the starting material and some production conditions altered from Concrete Example 1. That is, with the starting material of zinc metal complex $(Zn(C_5H_7O_2)_3.H_2O)$, vaporization temperature of 105° C., flow rate of the carrier gas (nitrogen gas) of 80 sccm, flow rate of the oxygen gas $(O_2)$ of 80 sccm, rf power of 1.2 W/cm², and substrates 3 temperature of 150° C., an oxide thin film was formed on the substrates 3. Consequently, a ZnO film having a Wurtzite crystalline structure oriented with respect to the (001) face was obtained as shown in the second line of the below mentioned Table 3. The result of the scanning electron microscope analysis showed that the formed ZnO film had a closely packed polycrystalline film with a grain size of approximately 0.13 μm. The film had a smooth surface, a thickness of 1.8 μm and a deposition rate of 90 nm/min. Variance of the film thickness among the specimen pieces was within 2%.

(Concrete Example 17)

An oxide thin film was formed on the substrates 3 with the starting material, substrates 3 and production conditions altered from Concrete Example 1. That is, with the starting material of zinc metal complex $(Zn(C_5H_7O_2)_3.H_2O)$, vaporization temperature of 90° C., flow rate of the carrier gas (nitrogen gas) of 80 sccm, flow rate of the oxygen gas $(O_2)$ of 50 sccm, rf power of 1.0 W/cm², pressure of 5 Torr, substrate-nozzle angle of 5° C., substrates 3 of silicon single crystal (100), substrate 3 temperature of 400° C., and the revolution rate of the substrates 3 of 100 rpm, an oxide thin film was formed on the substrates 3. Consequently, a ZnO film having a Wurtzite crystalline structure oriented with respect to the (001) face similar to the result of the Concrete Example 16 was obtained as shown in the third line of the below mentioned Table 3. The deposition rate was 45 nm/min.

(Concrete Example 18)

An oxide thin film was formed on the substrates 3 with the starting material, substrates 3 and production conditions altered from Concrete Example 1. That is, with the starting material of zinc metal complex $(Zn(C_5H_7O_2)_2.H_2O)$, vaporization temperature of 100° C., flow rate of the carrier gas (nitrogen gas) of 40 sccm, flow rate of the oxygen gas $(O_2)$ of 90 sccm, rf power of 0.9 W/cm², pressure of 0.005 Torr, substrate-nozzle angle of 45°, substrates 3 of stainless steel, substrate 3 temperature of 300° C., and the revolution rate of the substrates 3 of 150 rpm, an oxide thin film was formed on the substrates 3. Consequently, a ZnO film having a Wurtzite crystalline structure oriented with respect to the (001) face similar to the result of the Concrete Example 16 was obtained as shown in the fourth line of the below mentioned Table 3. The deposition rate was 80 nm/min.

(Concrete Example 19)

An oxide thin film was formed on the substrates 3 with the starting material, substrates 3 and some production conditions altered from Concrete Example 1. That is, with the starting material of zinc metal complex $(Zn(C_5H_7O_2)_2)$.$H_2O$), vaporization temperature of 100° C., flow rate of the carrier gas (nitrogen gas) of 50 sccm, flow rate of the oxygen gas $(O_2)$ of 80 sccm, substrate 3 of sapphire (012), substrate 3 temperature of 400° C., and the revolution rate of the substrates 3 of ⅓ rpm, an oxide thin film was formed on the substrates 3. Consequently, a ZnO film having a Wurtzite crystalline structure oriented with respect to the (001) face similar to the result of the Concrete Example 16 was obtained as shown in the fifth line of the below mentioned Table 3. The deposition rate was 72 nm/min.

(Concrete Example 20)

An oxide thin film was formed on the substrates 3 with the starting material and some production conditions altered from Concrete Example 1. That is, with the starting material of zinc metal complex $(Zn(C_5H_7O_2)_2).H_2O$), vaporization temperature of 120° C., flow rate of the oxygen gas $(O_2)$ of 100 sccm, rf power of 1.0 W/cm², pressure of 0.01 Torr, substrate-nozzle angle of 10°, substrate 3 temperature of 500° C., and the revolution rate of the substrates 3 of 100 rpm, an oxide thin film was formed on the substrates 3. Consequently, a ZnO film having a Wurtzite crystalline structure oriented with respect to the (001) face similar to the result of the Concrete Example 16 was obtained as shown in the sixth line of the below mentioned Table 3. The deposition rate was 110 nm/min.

In Tables 1 to 3, A denotes Comparative Example, B starting material, C vaporization temperature (°C.), D flow rate of carrier gas (sccm), E flow rate of $O_2$ gas (sccm), F rf power (W/cm²), G pressure (Torr), H substrate-nozzle angle θ (°), I kind of substrate, J substrate temperature (°C.), K revolution rate of substrates (min⁻¹), L analysis result, and M deposition rate (nm/min).

TABLE 1

| A B | | C | D | E | F | G | H | I | J | K | L | M |
|---|---|---|---|---|---|---|---|---|---|---|---|---|
| 1 | $Mg(C_5H_7O_2)_2$ | 235 | 100 | 200 | 1.4 | 0.1 | 20 | glass | 350 | 60 | (100) orientation MgO | 60 |
| 2 | $Mg(C_5H_7O_2)_2$ | 240 | 90 | 40 | 1.0 | 0.4 | 20 | glass | 200 | 100 | (110) orientation MgO | 70 |
| 3 | $Mg(C_{11}H_{19}O_2)_2$ | 100 | 100 | 200 | 1.0 | 1 | 20 | silicon single crystal (111) | 500 | 1 | (100) orientation MgO | 83 |
| 4 | $Ni(C_5H_7O_2)_2.2H_2O$ | 170 | 50 | 100 | 1.5 | 0.2 | 5 | stainless steel | 300 | 1/6 | (100) orientation | 104 |
| 5 | $Ni(C_5H_7O_2)_2.2H_2O$ | 170 | 100 | 40 | 1.0 | 0.01 | 30 | aluminum | 150 | 120 | (100) orientation NiO | 110 |
| 6 | $Ni(C_{11}H_{19}O_2)_2$ | 140 | 100 | 20 | 1.0 | 0.005 | 45 | glass | 400 | 50 | (111) orientation NiO | 90 |
| 7 | $Co(C_5H_7O_2)_3$ | 145 | 40 | 15 | 0.8 | 0.01 | 10 | silicon single crystal (100) | 650 | 100 | (100) orientation CoO | 45 |
| 8 | $Co(C_5H_7O_2)_3$ | 145 | 100 | 30 | 1.2 | 0.1 | 10 | sapphire (012) | 250 | 40 | (100) orientation CoO | 60 |
| 9 | $Co(C_5H_7O_2)_2.2H_2O$ | 125 | 100 | 20 | 1.0 | 0.1 | 10 | glass | 300 | 1/3 | (100) orientation CoO | 95 |
| 10 | $Co(C_5H_7O_2)_2.2H_2O$ | 125 | 150 | 60 | 1.0 | 5 | 20 | silicon single crystal (111) | 450 | 10 | (100) orientation CoO | 108 |

TABLE 2

| A | B | C | D | E | F | G | H | I | J | K | L | M |
|---|---|---|---|---|---|---|---|---|---|---|---|---|
| 11 | $Co(C_5H_7O_2)_2 \cdot 2H_2O$ | 125 | 100 | 150 | 1.0 | 0.2 | 20 | glass | 450 | 50 | (100) orientation $Co_3O_4$ | 80 |
| 12 | $Co(C_5H_7O_2)_2 \cdot 2H_2O$ | 125 | 100 | 150 | 1.0 | 5 | 5 | glass | 150 | 50 | (111) orientation $Co_3O_4$ | 78 |
| 13 | $Co(C_5H_7O_2)_3$ | 140 | 100 | 70 | 1.5 | 0.05 | 20 | silicon single crystal (100) | 200 | 100 | (111) orientation $Co_3O_4$ | 72 |
| 14 | $Fe(C_5H_7O_2)_3$ | 130 | 150 | 100 | 1.0 | 0.4 | 20 | stainless steel | 400 | 10 | (100) orientation $Fe_3O_4$ | 92 |
| 15 | $Fe(C_{11}H_{19}O_2)_3$ | 120 | 70 | 60 | 0.7 | 0.005 | 45 | glass | 350 | 150 | (100) orientation $Fe_3O_4$ | 106 |

TABLE 3

| A | B | C | D | E | F | G | H | I | J | K | L | M |
|---|---|---|---|---|---|---|---|---|---|---|---|---|
| 16 | $Zn(C_5H_7O_2)_2 \cdot H_2O$ | 105 | 80 | 80 | 1.2 | 0.1 | 20 | glass | 150 | 60 | (001) orientation ZnO | 90 |
| 17 | $Zn(C_5H_7O_2)_2 \cdot H_2O$ | 90 | 80 | 50 | 1.0 | 5 | 5 | silicon single crystal (100) | 400 | 100 | (001) orientation ZnO | 45 |
| 18 | $Zn(C_5H_7O_2)_2 \cdot H_2O$ | 100 | 40 | 90 | 0.9 | 0.005 | 45 | stainless steel | 300 | 150 | (001) orientation ZnO | 80 |
| 19 | $Zn(C_5H_7O_2)_2 \cdot H_2O$ | 100 | 50 | 80 | 1.4 | 0.1 | 20 | sapphire (012) | 400 | 1/3 | (001) orientation ZnO | 72 |
| 20 | $Zn(C_5H_7O_2)_2 \cdot H_2O$ | 120 | 100 | 100 | 1.0 | 0.01 | 10 | glass | 500 | 100 | (001) orientation ZnO | 110 |

In the present invention, when the tilt angle θ of the material gas supplier 8 with respect to the substrate holder 4 was less than 5°, although oxide thin films having a high quality crystallographic orientation were obtained, a high deposition rate was not achieved. On the other hand, when the tilt angle θ of the material gas supplier 8 with respect to the substrate holder 4 was larger than 45°, although oxide thin films were formed at a high deposition rate, it was difficult to achieve a high quality crystallographic orientation.

In the present invention, when the substrate temperature at the time of film formation was lower than 150° C., it was difficult to obtain oxide thin films having a high quality crystallographic orientation. On the other hand, when the substrate temperature at the time of film formation exceeded 650° C., since cracks were liable to occur due to the stress generated in the thin film, it was difficult to obtain oxide thin films having a high quality crystallographic orientation.

In the present invention, it was preferable to have a pressure at the time of film formation of from $5 \times 10^{-3}$ to 5 Torr to have oxide thin films having a high quality crystallographic orientation.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A process for producing an oxide thin film, comprising:
    holding a substrate on a rotatable substrate holder at a predetermined temperature in a reaction chamber provided with an exhaust, the substrate holder acting as a first electrode;
    supplying a material gas comprising a metal complex gas, oxygen gas and a carrier gas to the reaction chamber between the substrate holder and a second electrode in the reaction chamber while the substrate holder is rotating, the material gas being supplied from a material gas supplier located in the vicinity of the substrate between the substrate holder and the second electrode and positioned at a predetermined tilt angle with respect to the substrate holder so that a portion of the substrate is contacted by the material gas and a portion of the substrate is not contacted by the material gas at a given time, with a film being formed on the portion of the substrate contacted by the material gas and the film being annealed when in a position not contacted by the material gas;
    providing electric power between the second electrode and the substrate holder to produce plasma from the material gas supplied to the reaction chamber, the plasma being deposited on the substrate.

2. The process for producing an oxide thin film as claimed in claim 1, wherein the metal complex is a β-diketone complex of a metal selected from the group consisting of magnesium, nickel and cobalt.

3. The process for producing an oxide thin film as claimed in claim 1, wherein the metal complex is a β-diketone complex of a metal selected from the group consisting of iron and cobalt.

4. The process for producing an oxide thin film as claimed in claim 1, wherein the metal complex is a β-diketone complex of zinc.

5. The process for producing an oxide thin film as claimed in claim 1, wherein the substrate temperature at the time of forming an oxide thin film is from 150° C. to 650° C.

6. The process for producing an oxide thin film as claimed in claim 1, wherein the pressure in the reaction chamber at the time of forming the oxide thin film is from $5 \times 10^{-3}$ to 5 Torr.

7. The process for producing an oxide thin film as claimed in claim 1, wherein the tilt angle of the material gas supplier with respect to the substrate holder is from 5° to 45°.

* * * * *